(12) United States Patent
Chiu

(10) Patent No.: US 11,894,478 B2
(45) Date of Patent: Feb. 6, 2024

(54) FLEXIBLE ASSEMBLY WITH STAINLESS STEEL MESH PACKAGING STRUCTURE

(71) Applicant: Golden Solar (Quanzhou) New Energy Technology Co., Ltd., Quanzhou (CN)

(72) Inventor: Hsin-Wang Chiu, Quanzhou (CN)

(73) Assignee: GOLDEN SOLAR (QUANZHOU) NEW ENERGY TECHNOLOGY CO., LTD., Quanzhou (CN)

(*) Notice: Subject to any disclaimer, the term of this patent is extended or adjusted under 35 U.S.C. 154(b) by 118 days.

(21) Appl. No.: 17/557,001

(22) Filed: Dec. 20, 2021

(65) Prior Publication Data

US 2022/0416102 A1 Dec. 29, 2022

(30) Foreign Application Priority Data

Jun. 24, 2021 (CN) .......................... 202121415872.6

(51) Int. Cl.
*H01L 31/048* (2014.01)
*H01L 31/0392* (2006.01)
*H01L 31/049* (2014.01)

(52) U.S. Cl.
CPC ...... *H01L 31/03926* (2013.01); *H01L 31/049* (2014.12); *H01L 31/0481* (2013.01)

(58) Field of Classification Search
CPC . H01L 31/048; H01L 31/0481; H01L 31/049; H01L 31/03926
See application file for complete search history.

(56) References Cited

U.S. PATENT DOCUMENTS

| 2010/0206377 A1* | 8/2010 | Sahlin | H02S 20/23 |
| | | | 136/256 |
| 2013/0298969 A1* | 11/2013 | Chen | H01L 31/048 |
| | | | 136/251 |

FOREIGN PATENT DOCUMENTS

WO WO-2011017391 A2 * 2/2011 ............. B29C 33/68

* cited by examiner

*Primary Examiner* — Kourtney R S Carlson
(74) *Attorney, Agent, or Firm* — Bayramoglu Law Offices LLC

(57) ABSTRACT

A flexible assembly with a stainless steel mesh packaging structure includes a flexible back plate, a first hot melt adhesive, a solar cell string, a stainless steel mesh, a second hot melt adhesive, and a flexible front plate. The flexible back plate and the flexible front plate are respectively arranged on the outer surface of the first hot melt adhesive and the outer surface of the second hot melt adhesive, and the solar cell string and the stainless steel mesh are arranged between the first hot melt adhesive and the second hot melt adhesive. The stainless steel mesh is arranged at partial or all positions around the outer edge of the solar cell string and is continuously distributed or separately distributed. The stainless steel mesh is arranged around the solar cell string to further strengthen the strength of the flexible assembly and improve the tearing resistance of the flexible assembly.

6 Claims, 2 Drawing Sheets

FLEXIBLE ASSEMBLY WITH STAINLESS STEEL MESH PACKAGING STRUCTURE

CROSS REFERENCE TO THE RELATED APPLICATIONS

This application is based upon and claims priority to Chinese Patent Application No. 202121415872.6, filed on Jun. 24, 2021, the entire contents of which are incorporated herein by reference.

TECHNICAL FIELD

The present invention relates to the field of solar cell and flexible solar cell, and more particularly, to a flexible assembly with a stainless steel mesh packaging structure.

BACKGROUND

A flexible solar cell laid with a flexible back plate, a first hot melt adhesive, a cell string, a second hot melt adhesive, and a flexible front plate in a sequence is laminated to form a flexible silicon-based cell module, which can be used in solar backpacks, solar tents, solar cars, solar sailboats, and even solar aircraft as a type of solar cell, having advantages of advanced technology, excellent performance, low cost, a wide range of applications, and the like. However, delamination, deformation, de-welding of welding strips, yellowing of products and the like will occur when the flexible solar cell module is tested in an environment of high temperature and high humidity (85° C. or 85% humidity) for more than 1000 hours. In practical application, especially used in a relatively harsh application environment, such as high temperature, low temperature, high humidity, drought, or even long-term wind blowing in strong winds for a long period of time, product tearing and welding strip oxidation and de-welding caused by internal moisture immersion will also occur. In addition, a flexible solar cell assembly needs to be punched and embedded with metal buckles at the edge of the assembly for facilitating suspension or aesthetic purposes in practical applications, but the tearing phenomenon will occur in use due to the insufficient strength of the flexible front back plate. Therefore, all of the above are liable to result in the decline of the performance of the flexible solar cell assembly, and affect the quality of the flexible solar cell assembly.

SUMMARY

In order to solve the defects of the prior art, the present invention provides a flexible assembly with a stainless steel mesh packaging structure. The flexible assembly with the stainless steel mesh packaging structure includes a flexible back plate, a first hot melt adhesive, a solar cell string, a stainless steel mesh, a second hot melt adhesive, and a flexible front plate. The flexible back plate and the flexible front plate are respectively arranged on the outer surface of the first hot melt adhesive and the outer surface of the second hot melt adhesive, and the solar cell string and the stainless steel mesh are arranged between the first hot melt adhesive and the second hot melt adhesive. The stainless steel mesh is arranged at partial or all positions around the outer edge of the solar cell string, and the stainless steel mesh is continuously distributed or separately distributed.

Preferably, the stainless steel mesh is made of any stainless steel mesh materials such as SUS302, SUS304, SUS304L, SUS316, SUS316L, SUS310S and others. The stainless steel mesh is of at least one type of stainless steel plain mesh, stainless steel twill mesh, stainless steel bamboo pattern mesh, five heddle stainless steel mesh, stainless steel punching hole mesh, stainless steel chain link mesh and others. A mesh number of the stainless steel mesh is at least one of less than 20, 20, 30, 40, 60, 80, and more than 80. The width and the length of the stainless steel mesh can be adjusted and designed according to the size of a solar cell assembly and the installation requirements of the solar cell assembly.

Preferably, the flexible back plate is one of plastic films of ethyl tetra fluoro ethylene (ETFE), polyimide (PI), polyethylene terephthalate (PET), polyethylene naphthalate two formic acid glycol ester (PEN), polyvinylidene fluoride (PVDF), or composite films of fluorine-containing materials.

Preferably, the first hot melt adhesive and the second hot melt adhesive are one of ethyl vinyl acetate (EVA), Surlyn, and polyolefin elastomer (POE).

Preferably, the solar cell string is one of monocrystalline silicon cells, polysilicon cells, silicon-based heterojunctions, passivated emitter and rear cells (PERC), passivated emitter and rear locally-diffused cells (PERL), passivated emitter and rear totally-diffused cells (PERT), tunnel oxide passivated contact cells (TOPCon), interdigitated back contact cells (IBC), or heterojunction back contact cells (HBC).

Preferably, the flexible front plate is one of plastic films of ETFE, PET, PEN, transparent PVDF, or transparent composite films of fluorine-containing materials.

From the above description showing the structure of the present invention, compared with the prior art, the present invention has the following advantages:

In the flexible assembly with the stainless steel mesh packaging structure provided by the present invention, the stainless steel mesh is arranged at the partial or all positions around the outer edge of the solar cell string and is continuously distributed or separately distributed. Specifically, since the stainless steel has high corrosion resistance, high and low temperature resistance, oxidation resistance and strong plasticity, the stainless steel mesh is layered at the outer edge of the solar cell string and then laminated, so as to effectively protect the solar cell string and prevent external impurities such as water vapor from immersing and corroding the solar cell string, which can cause oxidation and yellowing of products, de-welding of welding strips, and other phenomena affecting the quality of the assembly. Furthermore, the stainless steel has the advantages of high hardness and excellent strength compared with the flexible back plate made from PET and the like, so that the setting of stainless steel mesh can further strengthen the strength of the flexible assembly and improve the tearing resistance of the flexible assembly. Specifically, the flexible assembly will not be torn even if the positions provided with the stainless steel mesh are punched and embedded with the metal buckle.

BRIEF DESCRIPTION OF THE DRAWINGS

The drawings forming part of the application are used to provide further understanding of the present invention, and the schematic embodiments of the present invention and the description thereof are used to explain the present invention and do not constitute an undue limitation of the present invention. In the drawings.

DETAILED DESCRIPTION OF THE EMBODIMENTS

In order to make the objectives, technical solutions, and advantages of the present invention clearer, the present invention is further explained in detail below in conjunction with the drawings and embodiments. It should be understood that the specific embodiments described herein are only used to explain the present invention and are not used to limit the present invention.

Figure 1:
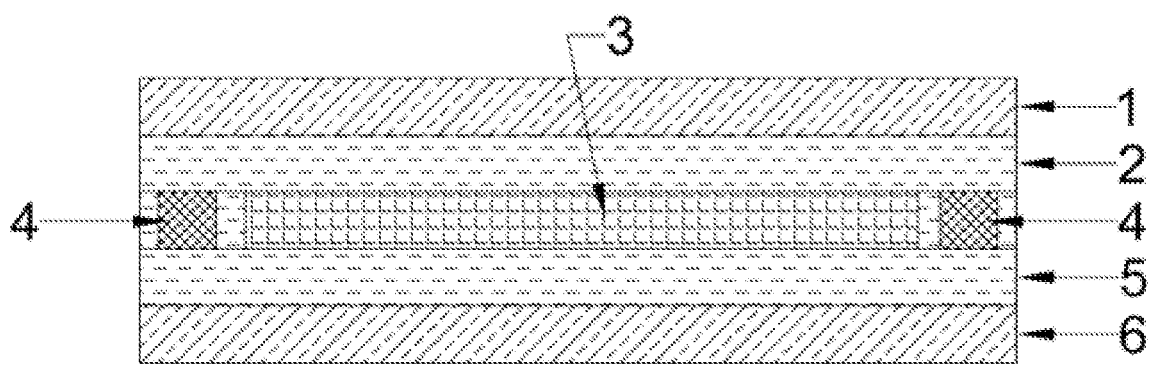
FIG. 1 is a schematic diagram showing the cross section of the structure of a flexible assembly with a stainless steel mesh packaging structure provided by the embodiments of the present invention.

As shown in FIG. 1, the present invention provides a flexible assembly with a stainless steel mesh packaging structure. The flexible assembly with the stainless steel mesh packaging structure includes the flexible back plate 1, the first hot melt adhesive 2, the solar cell string 3, the stainless steel mesh 4, the second hot melt adhesive 5, and the flexible front plate 6. The flexible back plate 1 and the flexible front plate 6 are respectively arranged on the outer surface of the first hot melt adhesive 2 and the outer surface of the second hot melt adhesive 5. The solar cell string 3 and the stainless steel mesh 4 are arranged between the first hot melt adhesive 2 and the second hot melt adhesive 5. The stainless steel mesh 4 is arranged at partial or all positions around the outer edge of the solar cell string 3 and is continuously distributed or separately distributed.

Figure 2:
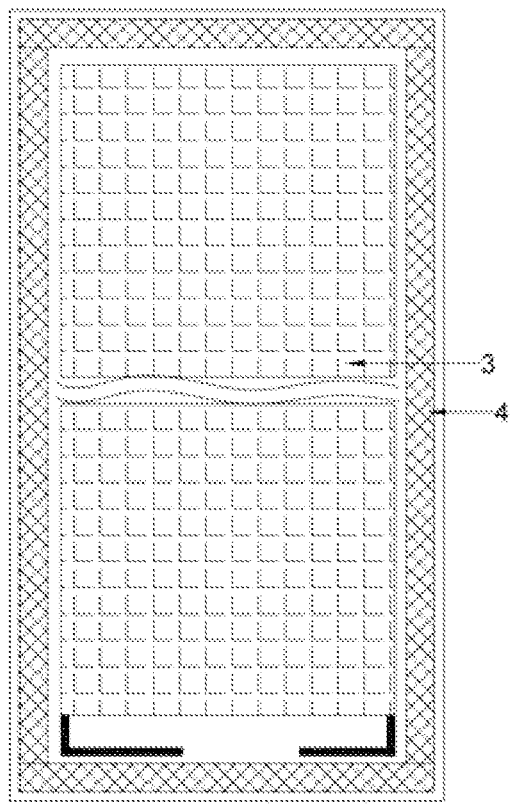
FIG. 2 is a schematic diagram showing the structure of the flexible assembly with the stainless steel mesh packaging structure provided by the embodiments of the present invention, where a stainless steel mesh is continuously arranged at all positions around a solar cell string.

As shown in FIG. 2, the stainless steel mesh 4 is arranged in all positions around the solar cell string 3 and distributed continuously, which can not only effectively protect the solar cell string, but also enhance the strength and tearing resistance of the flexible assembly.

Figure 3:
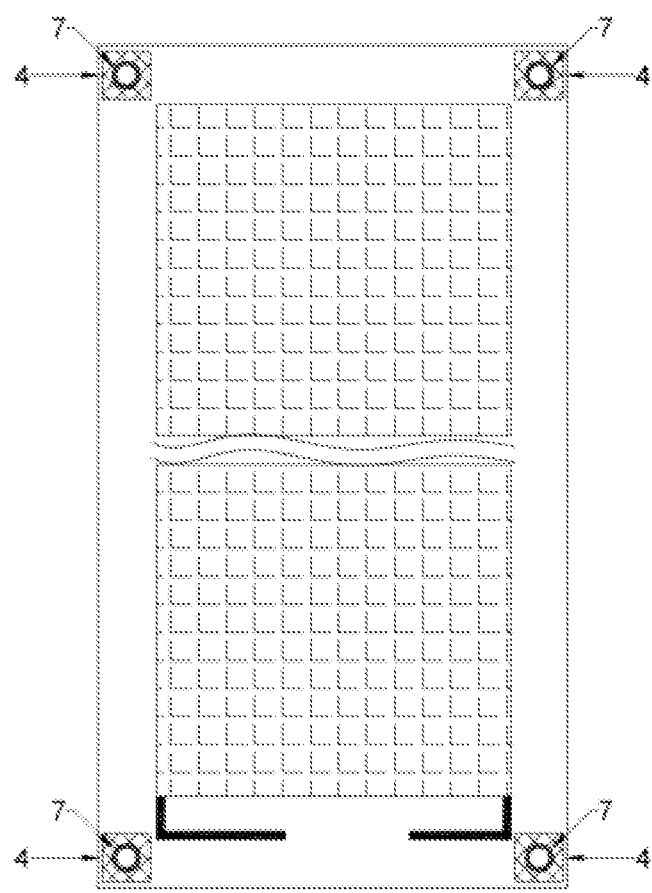
FIG. 3 is a schematic diagram showing the structure of the flexible assembly with the stainless steel mesh packaging structure provided by the embodiments of the present invention, where a stainless steel mesh is separately arranged at partial positions around a solar cell string.

As shown in FIG. 3, the stainless steel mesh 4 is arranged in partial positions around the solar cell string 3 and distributed separately, which can partially protect the solar cell string and enhance the strength of the flexible assembly. Moreover, in this way, the flexible assembly will not be torn even if the positions provided with the stainless steel mesh 4 are punched and embedded with the metal buckle 7.

Specifically, the stainless steel mesh 4 is made of any stainless steel mesh materials such as SUS302, SUS304, SUS304L, SUS316, SUS316L, SUS310s and others. The stainless steel mesh 4 is of at least one type of stainless steel plain mesh, stainless steel twill mesh, stainless steel bamboo pattern mesh, five heddle stainless steel mesh, stainless steel punching hole mesh, stainless steel chain link mesh and others. A mesh number of the stainless steel mesh 4 is at least one of less than 20, 20, 30, 40, 60, 80, and more than 80. The width and length of the stainless steel mesh 4 can be adjusted and designed according to the size of solar cell assembly and the installation requirements of solar cell assembly. The flexible back plate 1 is one of plastic films of ethyl tetra fluoro ethylene (ETFE), polyimide (PI), polyethylene terephthalate (PET), polyethylene naphthalate two formic acid glycol ester (PEN), polyvinylidene fluoride (PVDF), or composite films of fluorine-containing materials. The first hot melt adhesive 2 and the second hot melt adhesive 5 are one of ethyl vinyl acetate (EVA), Surlyn, and polyolefin elastomer (POE). The solar cell string 3 is one of monocrystalline silicon cells, polysilicon cells, silicon-based heterojunctions, passivated emitter and rear cells (PERC), passivated emitter and rear locally-diffused cells (PERL), passivated emitter and rear totally-diffused cells (PERT), tunnel oxide passivated contact cells (TOPCon), interdigitated back contact cells (IBC), or heterojunction back contact cells (HBC). The flexible front plate 6 is one of plastic films of ETFE, PET, PEN, transparent PVDF, or transparent composite films of fluorine-containing materials.

In the flexible assembly with the stainless steel mesh packaging structure provided by the present invention, the stainless steel mesh is arranged at the partial or all positions around the outer edge of the solar cell string and is continuously distributed or separately distributed. Specifically, since the stainless steel has high corrosion resistance, high and low temperature resistance, oxidation resistance and strong plasticity, the stainless steel mesh is layered at the outer edge of the solar cell string and then laminated, so as to effectively protect the solar cell string and prevent external impurities such as water vapor from immersing and corroding the solar cell string, which can cause oxidation and yellowing of products, de-welding of welding strips, and other phenomena affecting the quality of the assembly. Furthermore, the stainless steel has the advantages of high hardness and excellent strength compared with the flexible back plate made from PET and the like, so that the setting of stainless steel mesh can further strengthen the strength of the flexible assembly and improve the tearing resistance of the flexible assembly. Specifically, the flexible assembly will not be torn even if the positions provided with the stainless steel mesh are punched and embedded with the metal buckle.

The above are only better embodiments of the present invention and are not used to limit the present invention. Any modifications, equivalent replacements, and improvements made within the spirit and principles of the present invention shall fall within the scope of protection of the present invention.

What is claimed is:

1. A flexible assembly with a stainless steel mesh packaging structure, comprising a flexible back plate, a first hot melt adhesive, a solar cell string, a stainless steel mesh, a second hot melt adhesive, and a flexible front plate, wherein the flexible back plate and the flexible front plate are respectively arranged on an outer surface of the first hot melt adhesive and an outer surface of the second hot melt adhesive, the solar cell string and the stainless steel mesh are arranged between the first hot melt adhesive and the second hot melt adhesive, wherein the solar cell string is in direct physical contact with the first hot melt adhesive and the second hot melt adhesive, and the stainless steel mesh is also in direct physical contact with the first hot melt adhesive and the second hot melt adhesive; the stainless steel mesh is arranged at partial or all positions around an outer edge of the solar cell string, and the stainless steel mesh is continuously distributed or separately distributed.

2. The flexible assembly with the stainless steel mesh packaging structure according to claim 1, wherein the stainless steel mesh is made of stainless steel mesh materials; the stainless steel mesh is of at least one type of a stainless steel plain mesh, a stainless steel twill mesh, a stainless steel bamboo pattern mesh, a five heddle stainless steel mesh, a stainless steel punching hole mesh, and a stainless steel chain link mesh; a mesh number of the stainless steel mesh is less than 20, 20, 30, 40, 60, 80, or more than 80; a width of the stainless steel mesh and a length of the stainless steel mesh are adjusted and designed according to a size of a solar cell assembly and installation requirements of the solar cell assembly.

3. The flexible assembly with the stainless steel mesh packaging structure according to claim 1, wherein the flexible back plate is one of plastic films of an ethyl tetra fluoro ethylene (ETFE), a polyimide (PI), a polyethylene terephthalate (PET), a polyethylene naphthalate two formic acid glycol ester (PEN), a polyvinylidene fluoride (PVDF), or composite films of fluorine-containing materials.

4. The flexible assembly with the stainless steel mesh packaging structure according to claim 1, wherein the first hot melt adhesive and the second hot melt adhesive are one of an ethyl vinyl acetate (EVA), a Surlyn, and a polyolefin elastomer (POE).

5. The flexible assembly with the stainless steel mesh packaging structure according to claim 1, wherein the solar cell string is one of monocrystalline silicon cells, polysilicon cells, silicon-based heterojunctions, passivated emitter and rear cells (PERC), passivated emitter and rear locally-diffused cells (PERL), passivated emitter and rear totally-diffused cells (PERT), tunnel oxide passivated contact cells (TOPCon), interdigitated back contact cells (IBC), and heterojunction back contact cells (HBC).

6. The flexible assembly with the stainless steel mesh packaging structure according to claim 1, wherein the flexible front plate is one of plastic films of an ethyl tetra fluoro ethylene (ETFE), a polyethylene terephthalate (PET), a polyethylene naphthalate two formic acid glycol ester (PEN), a transparent polyvinylidene fluoride (PVDF), or transparent composite films of fluorine-containing materials.

* * * * *